United States Patent
Fee et al.

(10) Patent No.: US 7,075,816 B2
(45) Date of Patent: Jul. 11, 2006

(54) QUAD FLAT NO-LEAD (QFN) GRID ARRAY PACKAGE, METHOD OF MAKING AND MEMORY MODULE AND COMPUTER SYSTEM INCLUDING SAME

(75) Inventors: Setho Sing Fee, Singapore (SG); Lim Thiam Chye, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/729,180

(22) Filed: Dec. 5, 2003

(65) Prior Publication Data

US 2004/0114426 A1      Jun. 17, 2004

Related U.S. Application Data

(62) Division of application No. 09/933,297, filed on Aug. 20, 2001.

(30) Foreign Application Priority Data

Aug. 6, 2001 (SG) ................................. 200104675

(51) Int. Cl.
*G11C 11/00* (2006.01)
(52) U.S. Cl. ...................................... 365/158; 365/214
(58) Field of Classification Search ................ 365/214, 365/208, 158, 279; 257/700, 279, 777
See application file for complete search history.

(56) References Cited

U.S. PATENT DOCUMENTS

| | | | |
|---|---|---|---|
| 5,286,656 A * | 2/1994 | Keown et al. ................ 438/18 |
| 5,656,550 A | 8/1997 | Tsuji et al. |
| 5,714,800 A * | 2/1998 | Thompson ................... 257/690 |
| 6,001,671 A | 12/1999 | Fjelstad |
| 6,081,029 A | 6/2000 | Yamaguchi |
| 6,130,473 A | 10/2000 | Mostafazadeh et al. |
| 6,150,709 A | 11/2000 | Shin et al. |
| 6,177,722 B1 | 1/2001 | Kovats et al. |
| 6,184,067 B1 * | 2/2001 | Casper ........................ 438/123 |
| 6,190,938 B1 | 2/2001 | Liu |
| 6,198,165 B1 | 3/2001 | Yamaji et al. |

(Continued)

FOREIGN PATENT DOCUMENTS

JP      2000-243787      9/2000

OTHER PUBLICATIONS

Australian Search Report dated Sep. 8, 2004, 4 pages.

*Primary Examiner*—Thong Q. Le
(74) *Attorney, Agent, or Firm*—TraskBritt (57) ABSTRACT

A quad flat no-lead (QFN) grid array semiconductor package and method for making the same is disclosed. The package includes a semiconductor die and a lead frame having a plurality of conductive elements patterned in a grid-type array. A plurality of bond pads on the semiconductor die is coupled to the plurality of conductive elements, such as by wire bonding. The semiconductor die and at least a portion of the lead frame are encapsulated in an insulative material, leaving the conductive elements exposed along a bottom major surface of the package for subsequent electrical connection with higher-level packaging. Individual conductive lead elements, as well as the grid array pattern, are formed by wire bonding multiple bond pads to a single lead at different locations and subsequently severing the leads between the bonding locations to form multiple conductive elements from each individual lead.

20 Claims, 5 Drawing Sheets

U.S. PATENT DOCUMENTS

| | | |
|---|---|---|
| 6,229,200 B1 | 5/2001 | Mclellan et al. |
| 6,255,740 B1 | 7/2001 | Tsuji et al. |
| 6,281,047 B1 | 8/2001 | Wu et al. |
| 6,284,563 B1 * | 9/2001 | Fjelstad ............... 438/106 |
| 6,294,830 B1 | 9/2001 | Fjelstad |
| 6,342,730 B1 | 1/2002 | Jung et al. |
| 6,348,726 B1 | 2/2002 | Bayan et al. |
| 6,350,668 B1 * | 2/2002 | Chakravorty ........... 438/612 |
| 6,372,539 B1 | 4/2002 | Bayan et al. |
| 6,399,415 B1 | 6/2002 | Bayan et al. |
| 6,400,004 B1 | 6/2002 | Fan et al. |
| 6,405,359 B1 * | 6/2002 | Tseng et al. ............. 716/21 |
| 6,448,633 B1 | 9/2002 | Yee et al. |
| 6,451,627 B1 | 9/2002 | Coffman |
| 6,452,255 B1 | 9/2002 | Bayan et al. |
| 6,455,348 B1 | 9/2002 | Yamaguchi |
| 6,498,099 B1 | 12/2002 | McLellan et al. |
| 6,545,347 B1 | 4/2003 | McClellan |
| 6,585,905 B1 | 7/2003 | Fan et al. |
| 6,587,892 B1 * | 7/2003 | Casper ................... 257/358 |
| 6,635,957 B1 | 10/2003 | Kwan et al. |
| 6,686,652 B1 | 2/2004 | Bayan et al. |
| 6,689,640 B1 | 2/2004 | Mostafazadeh |
| 6,700,188 B1 | 3/2004 | Lin |
| 6,777,788 B1 | 8/2004 | Wan et al. |
| 6,812,552 B1 | 11/2004 | Islam et al. |
| 2002/0125559 A1 | 9/2002 | Mclellan |
| 2003/0164554 A1 * | 9/2003 | Fee et al. ............... 257/787 |

* cited by examiner

QUAD FLAT NO-LEAD (QFN) GRID ARRAY PACKAGE, METHOD OF MAKING AND MEMORY MODULE AND COMPUTER SYSTEM INCLUDING SAME

CROSS-REFERENCE TO RELATED APPLICATION

This application is a divisional of application Ser. No. 09/933,297, filed Aug. 20, 2001, now U.S Pat. No. 6,967, 125, issued Nov. 22, 2005.

BACKGROUND OF THE INVENTION

1. Field of the Invention

The present invention relates generally to semiconductor packaging. More specifically, the present invention relates to semiconductor packaging using a quad flat package design incorporating a lead frame and providing an increased number of input/output contacts arranged in a grid array.

2. State of the Art

Conventional quad flat packages (QFP) are formed with a semiconductor die connected to a lead frame and being encapsulated to form a package such that a plurality of leads extends laterally outwardly from each side of the periphery of the encapsulating structure. Such a configuration is relatively simple in design and may be efficiently produced. However, the QFP-type semiconductor has shown various design and production limitations. For example, reducing the overall package size of a QFP becomes difficult because of the arrangement of leads about the lateral periphery of the package. This is particularly evident when reduced package size is attempted to be combined with increasing the number of input/output (I/O) connections required for the smaller yet ever-more complex dice representing the state of the art.

In order to either reduce the size of a conventional QFP while at least maintaining, if not increasing, the number of connections or to increase the number of I/O connections while at least maintaining, if not decreasing, the package size, a higher density of connections would be required along the package perimeter. However, such an increased density of leads about the package perimeter inherently requires a reduced pitch or spacing between adjacent leads and promotes an increased likelihood of cross-talk and signal interference as well as making such packages more difficult to fabricate.

In an effort to increase the number of connections in an integrated circuit (IC) package while maintaining or decreasing the overall size, alternative packaging arrangements have been implemented. For example, grid array devices such as pin grid arrays (PGAs), ball grid arrays (BGAs), land grid arrays (LGAs) and their associated variants have been used to reduce package size and increase input/output connections. As an example of a grid array type device, a BGA device employs a number of input/output connections in the form of conductive bumps, such as solder balls, extending transversely from a major surface of the package in a pattern, or "array," of columns and rows. The conductive bumps may be formed on one surface of a circuit board or other interposer substrate and are in electrical connection with bonding pads on the opposing surface of the circuit board. A semiconductor die is coupled to the bonding pads, such as by wire bonding, to establish electrical connections from the bond pads of the semiconductor die to the conductive bumps. The resulting assembly is then typically encapsulated, such as by transfer molding with a filled polymer with the array of conductive bumps being left exposed for subsequent electrical connection to higher-level packaging such as a carrier substrate. The conductive bumps are configured to be coupled to a mirror image pattern of terminal pads on the carrier substrate which may comprise a printed circuit board (PCB) or another structure by reflowing the solder. In essence, a BGA device increases the number of input/output connections by allowing the connections to be positioned over substantially the entirety of a major surface of the package rather than extending laterally outwardly from the periphery of the package such as in a QFP.

While BGA and other grid array devices provide an increased number of input/output connections and may allow a simultaneous reduction in size for a given package, such devices are not without their own limitations and drawbacks. For example, the use of circuit board interposers, upon which the array of conductive elements is formed, imposes limitations on the size of the package since the circuit board is typically larger than the semiconductor die. Additionally, the circuit boards used in making BGA packages have been known to take on moisture during the fabrication process, leading to subsequent cracking and warpage which ultimately renders the device unusable. Furthermore, the cost of circuit boards used in the fabrication of grid array type devices may also be viewed as a drawback.

In view of the shortcomings in the art, it would be advantageous to provide a semiconductor die package which allows for a higher density of input/output connections without increasing package size. It would further be advantageous to provide such a package having a patterned array of input/output connections formed from a lead frame.

Additionally, it would be advantageous to provide a method of producing such a package, and the lead frame utilized in such a package, which does not require significant changes in tooling or fabrication processes such that the method is easily and efficiently implemented without incurring significant capital costs for new equipment or an increase in process steps.

BRIEF SUMMARY OF THE INVENTION

One aspect of the invention includes a method of forming a semiconductor die or IC package. The method includes providing a semiconductor die having a plurality of bond pads located on an active surface thereof. A lead frame having a plurality of conductive leads is provided adjacent the semiconductor die. A first bond pad on the semiconductor die is electrically coupled to a first portion of at least one conductive lead and a second bond pad is coupled to a second portion of the same lead. The first portion and second portion of the lead are then electrically isolated from one another to form two individual conductive elements from the original conductive lead. Additionally, an insulative encapsulant may be formed about the semiconductor die and at least partially about the lead frame while allowing a portion of each individual conductive element to remain exposed for subsequent electrical coupling with an external electrical circuit such as a carrier substrate.

The individual conductive elements may, for example, be electrically isolated from one another by saw cutting the conductive lead subsequent to the first and second portion being coupled to the bond pads of the semiconductor die. Also, a severance region may be predefined in the lead between the first portion and second portion so as to help facilitate the electrical isolation of the two portions. The severance region may include a notch or recess formed by scoring, cutting or etching partially through the material of the lead. Encapsulant covering the semiconductor die may be extended into the notch or recess of the severance region prior to isolating the first portion and second portion to help retain the first portion and second portion in their respective positions once they have been separated from one another by complete removal of any intervening lead material.

Another aspect of the present invention includes a method of forming an array of electrically conductive elements for an IC package. The method includes disposing a semiconductor die having a plurality of bond pads on an active surface thereof on a lead frame including a plurality of leads. At least two bond pads of the semiconductor die are electrically coupled with each lead of the lead frame. The leads are then severed between the locations of coupling to form at least two electrically isolated conductive elements, each such electrically isolated conductive element being coupled to an individual bond pad on the semiconductor die.

The present invention also includes a lead frame of a first design. The lead frame includes a plurality of individual leads. At least one of the plurality of leads includes a first bonding region, a second bonding region and a severance region located between the first and second bonding regions. The severance region is configured to facilitate separation of the first bonding region from the second bonding region subsequent to connection of bond pads of a semiconductor die to the respective first and second bonding regions and encapsulation of the lead frame and semiconductor die to form an IC package.

The present invention further includes a lead frame of a second design. This lead frame includes a die paddle configured for attachment of a semiconductor die thereto. The lead frame also includes a plurality of conductive elements, each having at least two bonding regions. The bonding regions are arranged in a grid array pattern which includes a first peripheral row of bonding regions spaced about a periphery of the die paddle and at least one other peripheral row of bonding regions spaced laterally outwardly from the first peripheral row.

Yet another aspect of the invention includes a semiconductor die or IC package. The IC package includes a semiconductor die, a lead frame and an electrically insulative encapsulant. The lead frame includes a plurality of spaced conductive elements arranged in an array including a first set of conductive elements on a major surface of the package and adjacent a lateral periphery thereof and at least one other set of conductive elements inwardly adjacent the first set. The insulative encapsulant extends over the semiconductor die and at least partially over the lead frame while allowing a portion of each of the conductive elements to be exposed on the major surface for connection with an external electrical circuit. At least one concavity or other recess is defined between and electrically isolates at least one conductive element of the first set and an adjacent conductive element of the at least one other set.

In accordance with another aspect of the invention, another IC package is provided. The IC package includes a semiconductor die having a plurality of bond pads and a lead frame having a plurality of conductive leads. Each of the plurality of conductive leads is electrically coupled to at least two bond pads of the plurality of bond pads.

In accordance with another aspect of the present invention, a memory module is provided. The memory module includes a carrier substrate in the form of a module board configured to be electrically coupled to another, higher-level packaging structure such as a motherboard, enabling the memory module to communicate with a processor. At least one IC package having features such as those described above is electrically coupled to the module board.

In accordance with another aspect of the invention, a computer system is provided. The computer system comprises an input device, an output device, a processor coupled to the input and output devices, and a memory module, such as described above, coupled with the processor.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE INVENTION

Figure 1:
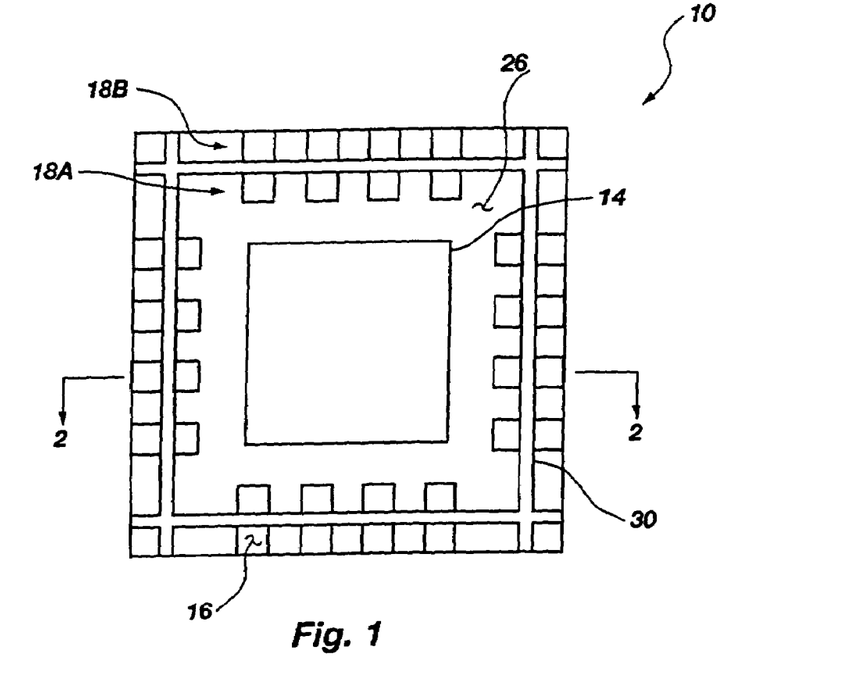
FIG. 1 is a plan view of the bottom of an IC package according to one embodiment of the present invention.
Figure 2:
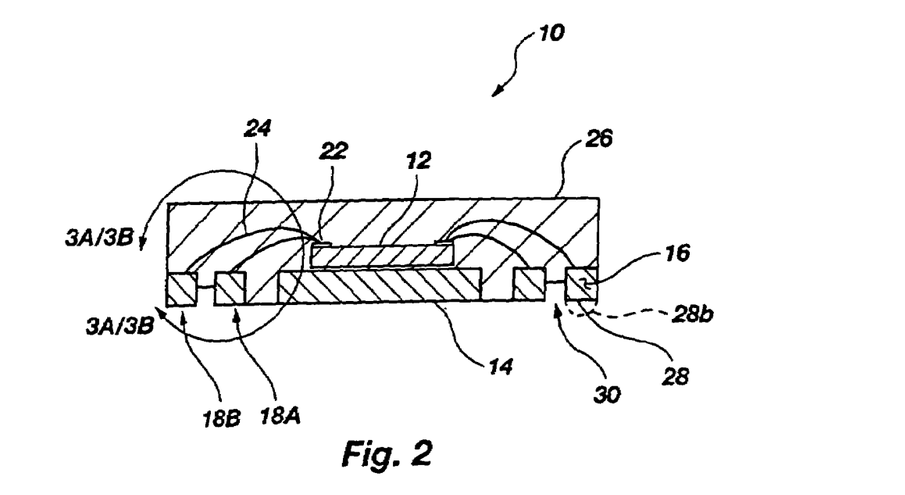
FIG. 2 is a cross-sectional view of the IC package of FIG. 1.

FIGS. 1 and 2 depict one embodiment of an IC package of the present invention in the form of a quad flat no-lead (QFN) grid array package 10. FIG. 1 presents a view of a major surface comprising the underside of the QFN package 10, while FIG. 2 shows a cross-section of the QFN package 10 taken along section line 2—2 as shown in FIG. 1. The QFN package 10 includes a semiconductor die 12 positioned on and secured by its back side to a die paddle 14, die paddle 14 originally comprising a portion of a lead frame as will be hereinafter described. Conductive elements 16 are positioned about the die paddle 14 in a grid array pattern, outwardly of semiconductor die 12 and adjacent the lateral periphery of QFN package 10. The die paddle 14 and conductive elements 16 may be formed of any suitable material such as copper, aluminum, alloy 42 or any other suitable conductive material for lead frames as understood by those of ordinary skill in the art.

The grid array pattern of the conductive elements 16 may be described in various geometrical terms such as a grid having a specified number of columns and rows. However, due to the general placement of the conductive elements 16 outwardly of the semiconductor die 12 and generally adjacent the lateral periphery of the QFN package 10, the grid array structure will be discussed in terms of peripheral rows. Thus, the QFN package 10 shown in FIGS. 1 and 2 includes a first inner peripheral row 18A and a second outer peripheral row 18B of conductive elements 16.

The language "peripheral row" is used herein for convenience in describing the configuration of the QFN package 10 and should not be understood as requiring all of the conductive elements 16 to be located at or on the lateral peripheral edge of the QFN package 10, nor should such phraseology be taken to mean that a given lateral peripheral row of conductive elements 16 must circumscribe the entire die paddle 14 and semiconductor die 12. While it is desirable to have the conductive elements 16 positioned about each side of the QFN package 10 so as to maximize the number of conductive elements 16 in the package, some designs may not require such an arrangement. Alternatively, some configurations may include peripheral rows that only partially circumscribe the die paddle 14 and semiconductor die 12, such as arrangements where peripheral rows lie on opposing sides of the QFN package 10.

The conductive elements 16 are each conductively coupled to a bond pad 22 on the active surface of semiconductor die 12 such as by wire bonds 24. The semiconductor die 12 and wire bonds 24 are encapsulated with an electrically insulative (dielectric) material 26 which also partially encapsulates the conductive elements 16 and extends between die paddle 14 and the inner peripheral row 18A of conductive elements 16, between the inner peripheral row 18A of conductive elements 16 and the outer peripheral row 18B of conductive elements 16 and between laterally adjacent conductive elements 16 of each of the inner and outer peripheral rows 18A and 18B, respectfully. The encapsulant material 26 may comprise a silicon particle-filled polymer encapsulant applied under heat and pressure by transfer molding, as well known in the art.

The conductive elements 16 each have an exposed surface 28 on the bottom major surface of the QFN package 10 for subsequent electrical coupling with another electrical component such as a carrier substrate (not shown). Such connection may be made, for example, through the use of conductive bumps 28b, shown in broken lines for clarity. Such bumps may include, for example, solder bumps which are stenciled onto conductive elements 16 and then reflowed to form balls, conductive or conductor-filled epoxy columns or pillars, or self-supporting spheres (either conductive or insulative) covered with a conductive material. It is further contemplated that an anisotropic, so-called "Z-axis" conductive material comprising laterally-spaced conductive elements in a dielectric film and oriented transversely to the plane thereof may also be employed to connect conductive elements 16 to a carrier substrate. All of the foregoing approaches, and others, are known to those of ordinary skill in the art and are not to be taken as limiting of the present invention.

Figure 3A:
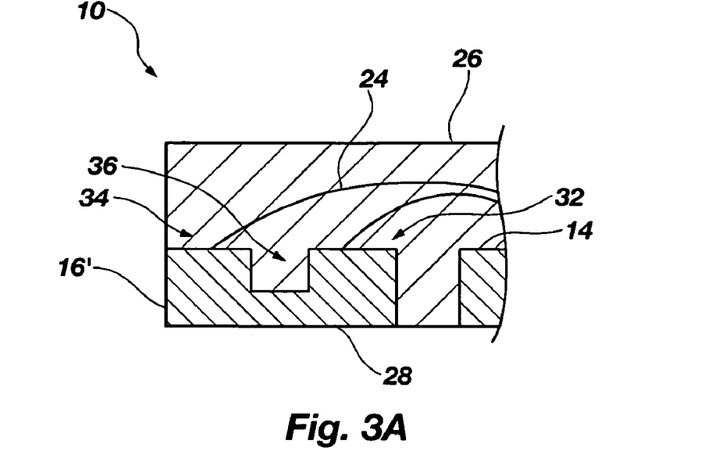
FIGS. 3A and 3B are enlarged views of the section specified in FIG. 2 at various stages of manufacturing.

The inner peripheral rows 18A and outer peripheral rows 18B of conductive elements 16 adjacent each edge of QFN package 10 are shown to be separated from one another by an elongated, trough-like concavity or recess 30. As shown in FIG. 2, the concavity or recess 30 is formed as an elongated saw cut or scribe line extending from a first lateral edge of the QFN package 10 to an opposing lateral edge. However, the concavity may be formed according to other techniques known in the art such as, for example, a masking and etching process. In the embodiment shown in FIGS. 1 and 2, the concavity or recess 30 serves to create the individual conductive elements 16 of the two inner and outer peripheral rows 18A and 18B, respectively, from a single row of individual, laterally extending leads 16' of a lead frame. The fabrication process can be seen more clearly with reference to FIGS. 3A and 3B. FIG. 3A depicts a partial section of the QFN package 10 showing the QFN package 10 at a stage in fabrication prior to formation of the individual conductive elements 16. The QFN package 10 shown in FIG. 3A includes a single lead 16' rather than individual conductive elements 16. It is further noted that there are multiple wire bonds 24 connected to different bonding regions 32, 34 of the lead 16'. A severance region 36, shown as an upwardly facing notch, is preformed in the lead 16' and subsequently filled with encapsulant 26 subsequent to attachment of semiconductor die 12 to die paddle 14 and wire bonding of a bond pad 22 (not shown in FIG. 3A) to bonding regions 32, 34. The notch of severance region 36 may be formed by various processes such as saw cutting, scribing, scoring or etching of the lead 16' prior to encapsulation of the lead 16' and wire bond 24 and preferably prior to attachment of semiconductor die 12 to die paddle 14.

Figure 3B:
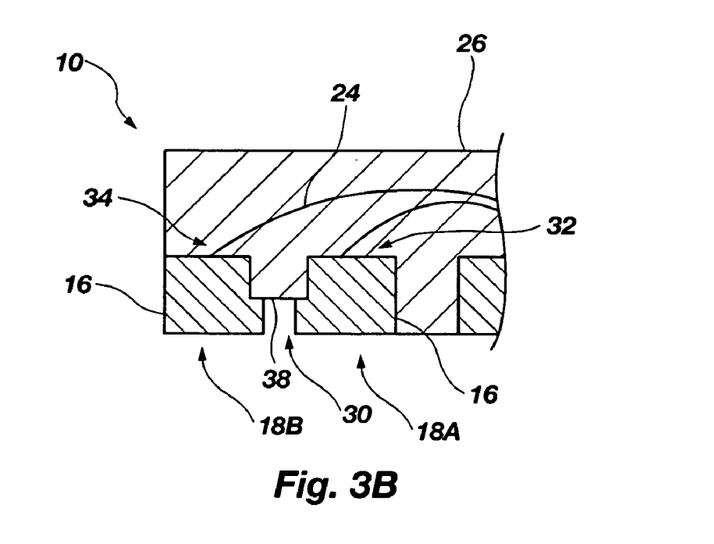

Subsequent to the application of encapsulant 26, the lead 16' may be severed, such as through the aforementioned saw cutting or etching, to form individual, electrically isolated conductive elements 16 as shown in FIG. 3B. Each conductive element 16 is connected to a wire bond 24 and thus to a bonding pad 22 of the semiconductor die 12 (not shown in FIG. 3B). It is noted that the severance region 36 serves various purposes. First, the severance region 36 identifies an area of separation on the lead 16'. This helps to identify the individual bonding regions 32, 34 during wire bonding of the lead 16' to the bond pads 22 of the semiconductor die 12. Additionally, the severance region 36 allows for the formation of a more shallow concavity or recess 30 during the separation of the lead 16' into individual conductive elements 16, such as to minimize the potential for damage to QFN package 10. Also, by forming the upwardly facing notch in the severance region 36 prior to encapsulation, the transfer-molded encapsulant 26 flows under pressure into the notch and substantially laterally about at least three sides of the ultimate location of each conductive element 16 to form a structural member 38 between and about the locations of individual conductive elements 16 to more effectively tie the conductive elements 16 to encapsulant 26, precisely fixing their locations and enabling the package to withstand the stresses placed on leads 16' without damage thereto or movement thereof.

While the severance region 36 is desirably in the form of a notch or recess as shown, it is contemplated that the severance region 36 of the lead 16' may simply be a designated area of separation without a notch or other physical feature. It is noted that, in such a case, the concavity or recess 30 extending upwardly from the bottom major surface of QFN package 10 would penetrate through the entire thickness of the lead 16' and there would be no encapsulant 26 formed between the adjacent inner and outer individual conductive elements 16 to serve as a structural member 38. If desired, a structural member 38 could be formed after the formation of the concavity or recess 30 by filling the same with dielectric material regardless of whether or not an upwardly facing, preformed notch or recess in each lead 16' is used to facilitate the formation of individual conductive elements 16.

Figure 4A:
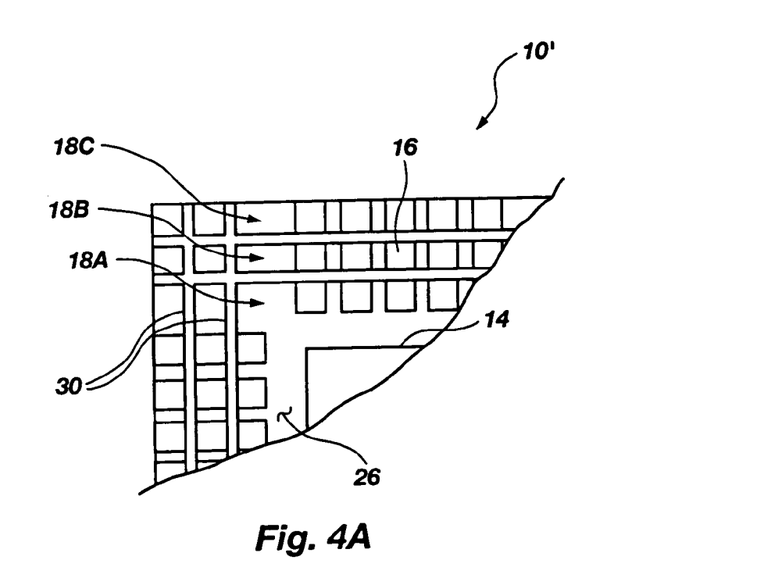
FIGS. 4A and 4B are partial plan views of an IC package according to alternative embodiments.
Figure 4B:
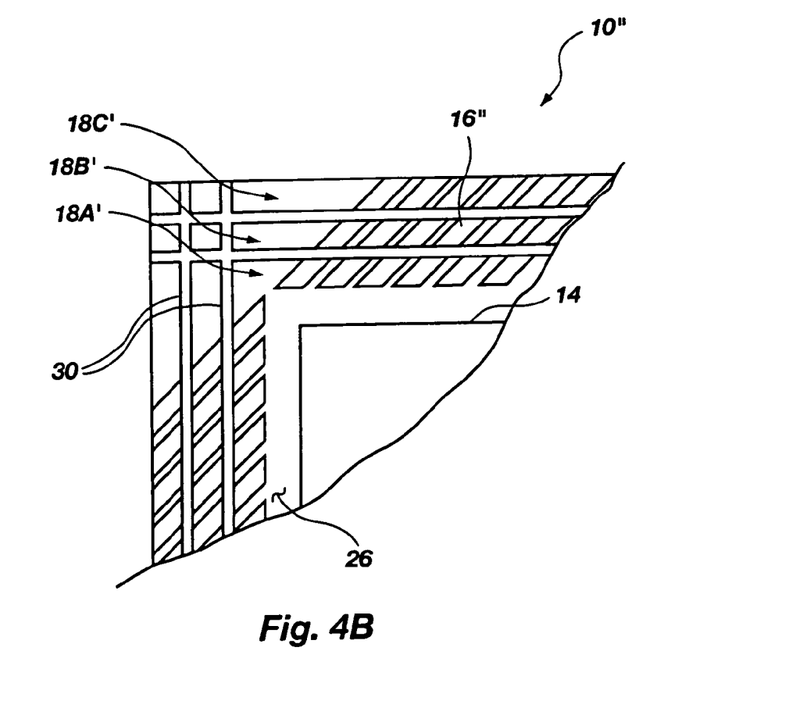

Referring to FIGS. 4A and 4B, alternative embodiments are shown with regard to the grid array pattern. FIG. 4A shows a portion of the bottom surface of a QFN package 10' having three different peripheral rows 18A, 18B and 18C of conductive elements 16. The conductive elements 16 are formed in a manner similar to that described above except that additional severance regions 36 (or notches) would be located in each lead 16' (see FIGS. 3A, 3B and 5) and that there are additional concavities or recesses 30 to assist in forming the third peripheral row 18C.

FIG. 4B shows a partial section of the bottom surface of a QFN package 10" also having three peripheral rows 18A', 18B' and 18C'. However, in the embodiment of FIG. 4B the conductive elements 16" of the peripheral rows 18A', 18B' and 18C' are staggered such that a conductive element 16" in peripheral row 18B' is shifted slightly to one side as compared to an adjacent conductive element 16" in peripheral row 18A'. Similarly, a conductive element 16" in peripheral row 18C' is shifted slightly to one side as compared to an adjacent conductive element 16" in peripheral row 18B'. Such an arrangement is possible by forming a lead frame having leads positioned at an angle other than perpendicular with respect to an adjacent edge of the die paddle 14. The individual peripheral rows 18A', 18B' and 18C' are formed in a manner similar to that described above, with elongated, trough-like concavities or recesses 30 being formed to ultimately create the individual conductive elements 16". The staggered configuration serves to allow more flexibility in wire bonding configurations and potentially lower bond loop heights due to the lateral staggering of the conductive elements 16". Thus, depending on the angle at which a lead 16' is formed on a lead frame, the offset of one peripheral row 18', 18B' and 18C', respectively, relative to another may be controlled and wire bonding configurations may be flexibly designed.

Figure 5:
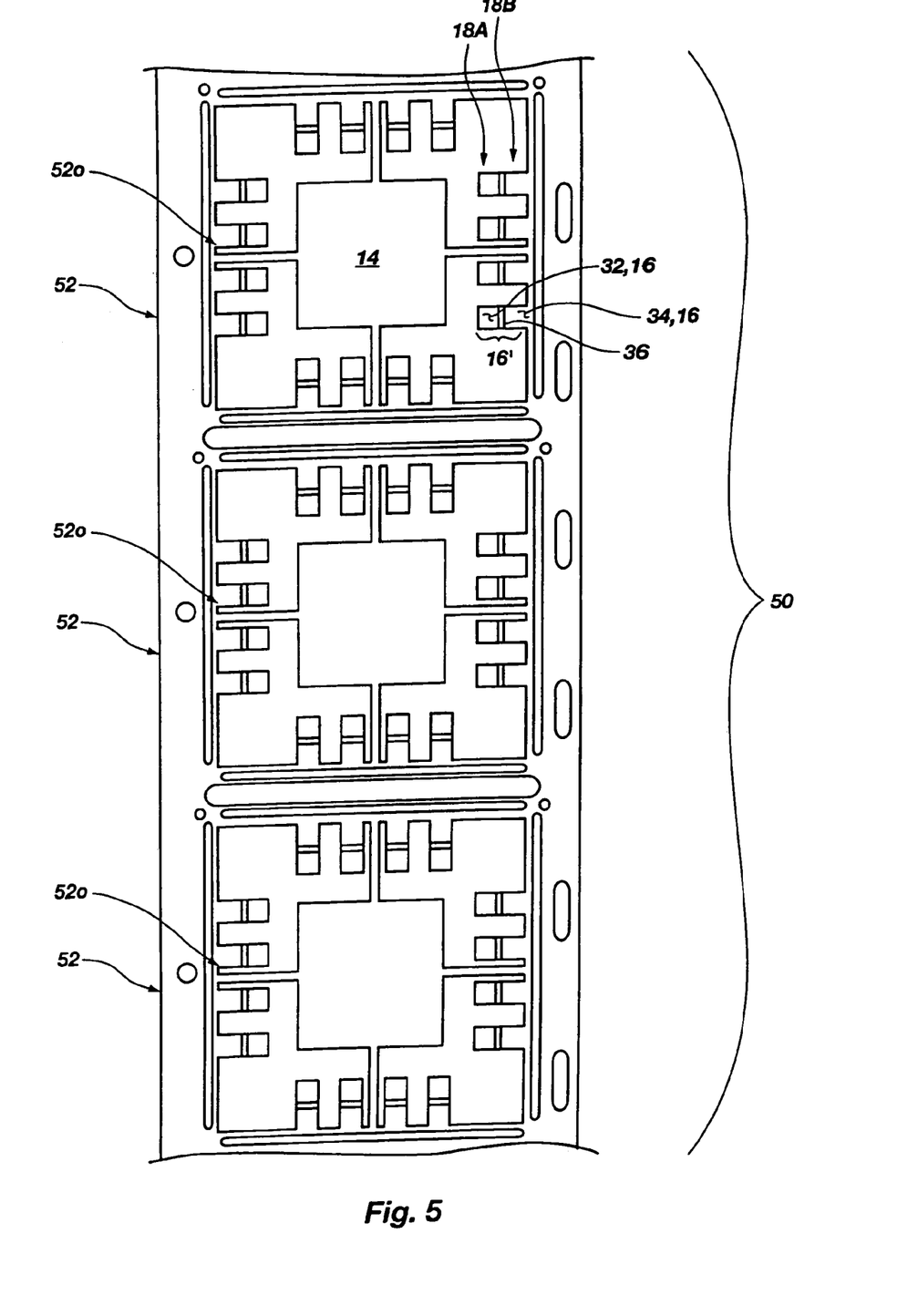
FIG. 5 is a plan view of a lead frame strip according to one embodiment of the present invention.

Referring now to FIG. 5, an exemplary lead frame strip 50 including a plurality of individual lead frames 52 for use in forming QFN packages 10 is shown. The multiple lead frames 52 are formed in a single, longitudinally extending lead frame strip 50 as is known by those of ordinary skill in the art. Each lead frame 52 includes an outer frame portion 52o bearing a die paddle 14 supported substantially in the center thereof by tie bars and multiple inwardly extending, cantilevered leads 16'. A reduced number of leads 16' is shown for clarity, but is not intended to be limiting of the invention. The leads 16' are each formed with a severance region 36, such as a notch or similar recess, for subsequent formation of individual conductive elements 16 from the leads 16'. As discussed above, the severance regions 36 may be formed by various techniques such as scoring, saw cutting, or etching. The severance regions 36 define the locations of the peripheral rows 18A and 18B which will be subsequently formed in the QFN package 10. The lead frames 52 depicted in FIG. 5 are representative of a lead frame 52 which might be used in the formation of a QFN package 10 described in conjunction with FIGS. 1 and 2. Other lead frames of suitable configuration and with similar features would be utilized in forming the QFN packages 10', 10" discussed in conjunction with FIGS. 4A or 4B, respectively, as is understood by those of ordinary skill in the art. In fabricating QFN packages of the present invention, the outer frame portions 52o are severed from the packages to effect electrical isolation of die paddle 14 as well as each set of conductive elements 16 from the outer frame portions 52o, while mutual electrical isolation between the conductive elements 16 formed from each lead 16' is effected by cutting through the leads 16' from the lead surfaces opposite the notches of severance regions 36. To facilitate alignment of the QFN packages for creating the concavities or recesses 30, it is preferred currently that QFN packages 10 be severed from outer frame portions 52o after such concavities or recesses 30 are cut or otherwise formed. If conductive bumps 28b (see FIG. 2) are to be formed or placed on conductive elements 16, it may also be desirable to form or place conductive bumps 28b while QFN packages 10 are still unsevered from lead frame strip 50 to facilitate alignment and handling.

Figure 6:
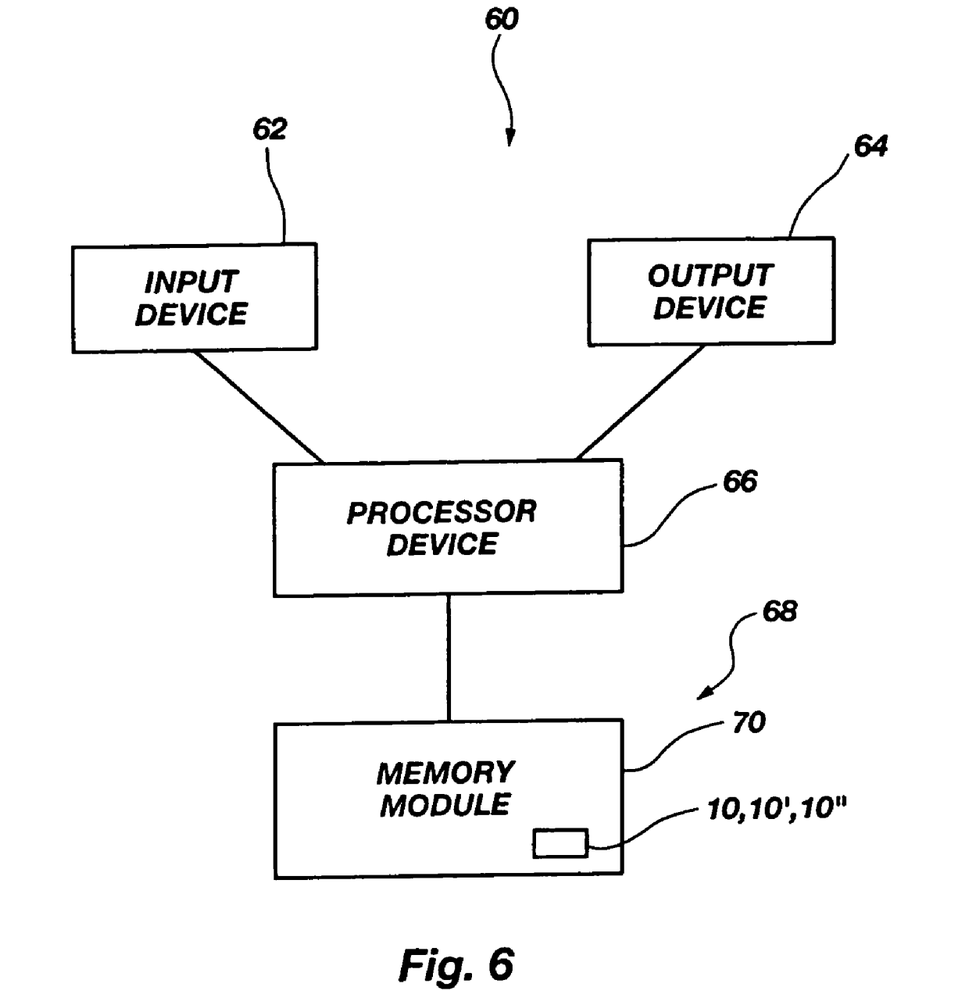
FIG. 6 is schematic of a computer system incorporating the IC package of the present invention.

Referring now to drawing FIG. 6, a schematic of an electronic system 60, such as a personal computer, including an input device 62 (such as a keyboard and mouse) and an output device 64 (such as a display or printer interface) coupled or otherwise in electrical communication with a processor device 66, is illustrated. Processor device 66 is also coupled or otherwise in operable electrical communication such as through traces of a motherboard with one or more memory modules 68 incorporating a plurality of QFN packages according to the present invention such as 10, 10', 10" or variations thereof. The memory module 68 may include a memory board 70 having an electrical circuit formed therein, such as a printed circuit board (PCB). Furthermore, processor, device 66 may be directly embodied in a module with a QFN package which incorporates the teachings hereof and may further include, without limitation, a microprocessor, a first level cache memory, and additional ICs, such as logic circuits, a video processor, an audio processor, or a memory management processor.

While the present invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An integrated circuit package comprising:
   a semiconductor die;
   a plurality of conductive elements arranged in an array, the array including at least a first set of spaced and electrically isolated conductive elements adjacent an outer lateral periphery of the integrated circuit package and at least one other set of spaced and electrically isolated conductive elements inwardly adjacent the at least a first set of conductive elements, the at least one other set of conductive elements being located outside a lateral periphery of the semiconductor die;
   a dielectric encapsulant formed over the semiconductor die and defining the outer lateral periphery of the integrated circuit package, the dielectric encapsulant extending at least partially laterally about the plurality of conductive elements and leaving an outer surface of each conductive element exposed; and
   a recess in the dielectric encapsulant between at least one conductive element of the at least a first set of conductive elements and at least one adjacent conductive element of the at least one other set of conductive elements.

2. The integrated circuit package of claim 1, wherein the semiconductor die includes a plurality of bond pads and wherein each of the plurality of bond pads is electrically connected with a conductive element of the plurality of conductive elements.

3. The integrated circuit package of claim 2, wherein the electrical connection between each of the plurality of bond pads and each respective conductive element of the plurality of conductive elements includes a wire bond.

4. The integrated circuit package of claim 1, wherein the conductive elements of the at least a first set of conductive elements are substantially aligned with the conductive elements of the at least one other set of conductive elements transverse to an adjacent outer lateral peripheral edge of the integrated circuit package.

5. The integrated circuit package of claim 4, wherein the conductive elements of the at least a first set of conductive elements are offset relative to the conductive elements of the at least one other set of conductive elements.

6. The integrated circuit package of claim 1, wherein the recess comprises an elongated, trough-like recess extending substantially between conductive elements of the at least a first set and conductive elements of the at least one other set disposed along a common laterally outer peripheral edge of the integrated circuit package.

7. A semiconductor die assembly, comprising: a semiconductor die having a plurality of bond pads; a lead frame having a plurality of conductive leads, each conductive lead being electrically
- coupled at spaced locations on the conductive lead to at least two bond pads of the
- plurality of bond pads; and a severance region defined on each conductive lead, the severence region being located and
- configured to facilitate separation of its associated conductive lead into at least two
- mutually electrically isolated conductive elements such that each of the at least two
- mutually electrically isolated conductive elements comprise at least one of the spaced
- locations to which a bond pad of the at least two bond pads are electrically coupled.

8. The semiconductor die assembly of claim 7, further comprising a dielectric encapsulant formed about the semiconductor die and partially about the lead frame.

9. The semiconductor die assembly of claim 7, further comprising a wire bond coupling each conductive lead at the spaced locations thereon to one of the at least two bond pads of the plurality of bond pads.

10. The semiconductor die assembly of claim 9, wherein the severance region of each conductive lead includes at least one notch formed in a surface thereof.

11. A memory module comprising:
- a module board configured to be electrically coupled with a higher level of packaging; and
- at least one integrated circuit package electrically coupled with the module board, the at least one integrated circuit package comprising:
  - a semiconductor die;
  - a plurality of conductive elements arranged in an array, the array including at least a first set of spaced and electrically isolated conductive elements adjacent an outer lateral periphery of the at least one integrated circuit package and at least one other set of spaced and electrically isolated conductive elements inwardly adjacent the at least a first set of conductive elements, the at least one other set of conductive elements being located outside a lateral periphery of the semiconductor die;
  - a dielectric encapsulant formed over the semiconductor die and defining the outer lateral periphery of the at least one integrated circuit package, the dielectric encapsulant extending at least partially laterally about the plurality of conductive elements and leaving an outer surface of each conductive element exposed; and
  - a recess in the dielectric encapsulant between at least one conductive element of the at least a first set of conductive elements and at least one adjacent conductive element of the at least one other set of conductive elements.

12. A computer system comprising:
an input device;
an output device;
a processor coupled to the input and output devices; and
a memory module coupled to the processor, the memory module comprising a module board coupled to at least one integrated circuit package comprising:
a semiconductor die;
a plurality of conductive elements arranged in an array, the array including at least a first set of spaced and electrically isolated conductive elements adjacent an outer lateral periphery of the at least one integrated circuit package and at least one other set of spaced and electrically isolated conductive elements inwardly adjacent the at least a first set of conductive elements, the at least one other set of conductive elements being located outside a lateral periphery of the semiconductor die;
a dielectric encapsulant formed over the semiconductor die and defining the outer lateral periphery of the at least one integrated circuit package, the dielectric encapsulant extending at least partially laterally about the plurality of conductive elements and leaving an outer surface of each conductive element exposed; and
a recess in the dielectric encapsulant between at least one conductive element of the at least a first set of conductive elements and at least one adjacent conductive element of the at least one other set of conductive elements.

13. A semiconductor die assembly, comprising:
a semiconductor die having a plurality of bond pads on an active surface thereof;
at least one set of mutually spaced conductive elements laterally outboard of at least one peripheral edge of the semiconductor die, and at least another set of mutually spaced conductive elements spaced from and laterally outboard of the at least one set of conductive elements;
a plurality of wire bonds extending between bond pads of the plurality and conductive elements of the at least one set and the at least another set; and
a package comprising dielectric material extending over the semiconductor die and the plurality of wire bonds and having an outer lateral periphery substantially coincident with outer lateral extents of the at least another set of conductive elements, dielectric material of the package extending at least partially about each of the conductive elements of the at least one set and the at least another set and leaving a surface thereof exposed.

14. The semiconductor die assembly of claim 13, further comprising a die paddle to which the semiconductor die is secured by a back side thereof.

15. The semiconductor die assembly of claim 13, wherein the at least one set of conductive elements and the at least another set of conductive elements extend around a plurality of peripheral edges of the semiconductor die.

16. The semiconductor die assembly of claim 13, wherein the at least one set of conductive elements and the at least another set of conductive elements extend around four peripheral edges of the semiconductor die.

17. The semiconductor die assembly of claim 13, further including an elongated, trough-like recess extending between conductive elements of the at least one set and conductive elements of the at least another set and substantially parallel to the at least one peripheral edge of the semiconductor die.

18. The semiconductor die assembly of claim 13, wherein the exposed surfaces of the conductive elements of the at least one set and the at least another set are oriented substantially parallel to the active surface of the semiconductor die.

19. The semiconductor die assembly of claim 7 wherein the plurality of conductive leads extend substantially perpendicular an adjacent outer lateral peripheral edge of the semiconductor die.

20. The semiconductor die assembly of claim 7 wherein the plurality of conductive leads extend around a plurality of peripheral edges of the semiconductor die.

* * * * *